United States Patent [19]

Cleary, Jr. et al.

[11] Patent Number: 4,686,390
[45] Date of Patent: Aug. 11, 1987

[54] DIGITAL PEAK-HOLD CIRCUIT

[75] Inventors: Edward J. Cleary, Jr., Aloha; Mike R. Coleman, Beaverton, both of Oreg.

[73] Assignee: Tektronix, Inc., Beaverton, Oreg.

[21] Appl. No.: 878,549

[22] Filed: Jun. 26, 1986

[51] Int. Cl.$^4$ .................... H03K 5/153; G01R 19/04
[52] U.S. Cl. .................................. 307/351; 307/359; 324/103 P; 328/151
[58] Field of Search ............... 307/351, 353, 354, 359, 307/356; 328/151; 324/103 P; 377/39, 42

[56] References Cited

U.S. PATENT DOCUMENTS 4,204,260  5/1980  Nysen .................................. 307/359
4,560,940  12/1985  van der Schans .................. 307/351

OTHER PUBLICATIONS

M. O. Palva, "Detect and Hold an Analog-Signal Peak with an A/D Converter and an 8-Bit Latch", Electronic Design 16, vol. 26, Aug. 2, 1978, p. 92.

Primary Examiner—John Zazworsky
Attorney, Agent, or Firm—Francis I. Gray

[57] ABSTRACT

A digital peak-hold detector for determining the peak value of an input analog voltage to be displayed on a multiple-element display device detects when the value of the input analog voltage exceeds the value of a ramp-like waveform generated from a counter which repetitively counts down from a number equal to the total number of display elements to zero to generate a compare signal. A control circuit strobes the count corresponding to the peak value into a storage register when the value of the input analog voltage exceeds the current peak value in the storage register. A digital comparator compares the current peak value from the storage register with the repetitive count from the counter and outputs an update signal when the value of the count is greater than the current peak value. The update signal is combined with the compare signal by the control circuit to make the determination whether to update the current peak value. A time delay circuit causes the control circuit to clear the storage register to generate a new peak value when the current peak value is not updated within a predetermined period of time.

5 Claims, 4 Drawing Figures

DIGITAL PEAK-HOLD CIRCUIT

BACKGROUND OF THE INVENTION

The present invention relates to peak-hold circuits, and more particularly to a digital peak-hold circuit for more precise determination of peak values of an input voltage.

A multiple-element display, such as that described in co-pending U.S. patent application Ser. No. 850,198 filed Apr. 10, 1986 by Edward J. Cleary, Jr. et al entitled "Circuit for Driving a Multiple-Element Display", can incorporate a circuit for determining and displaying precision peak value measurements. Such a multiple-element display displays both an instantaneous value of an input signal and a retained peak value of the input signal. Analog peak-hold circuits use a storage capacitor which gradually decays from the stored peak value, causing the peak indication to drop. Additionally analog circuits are inherently more susceptible to noise pickup, power supply ripple and the like which all contribute to an error in the indicated peak value.

Therefore what is desired is a peak-hold circuit which more closely approximates the ideal without peak value decay or susceptibility to outside disturbances.

SUMMARY OF THE INVENTION

Accordingly, the present invention provides a digital peak-hold circuit which stores a digital value for the peak value of an input voltage, which value is updated either when a higher value is detected or after a specified period times out. A compare signal, representative of the detected value of an input voltage, is input to a control circuit where it is passed directly on to appropriate multiple display elements for display of the instantaneous value of the input voltage as well as being stored in a storage register if greater than or equal to the current stored peak value. A digital comparator compares the stored peak value with a repetitive digital count corresponding to the number of multiple display elements and outputs an update signal when the count is equal to or greater than the stored peak value. The update signal is combined with the compare signal such that the control circuit updates the stored peak value when the input voltage, as represented by the compare signal, is present simultaneously with the update signal. A time delay is restarted each time a value is stored in the storage register. If the time delay times out, the control circuit clears the storage register to obtain a new starting peak value of the input voltage. The peak value is combined with the compare signal so that both the instantaneous value of the input voltage and the peak value are displayed simultaneously.

The objects, advantages and novel features of the present invention will be apparent from the following detailed description when read in conjunction with the appended claims and attached drawing.

DESCRIPTION OF THE PREFERRED EMBODIMENT

Figure 1:
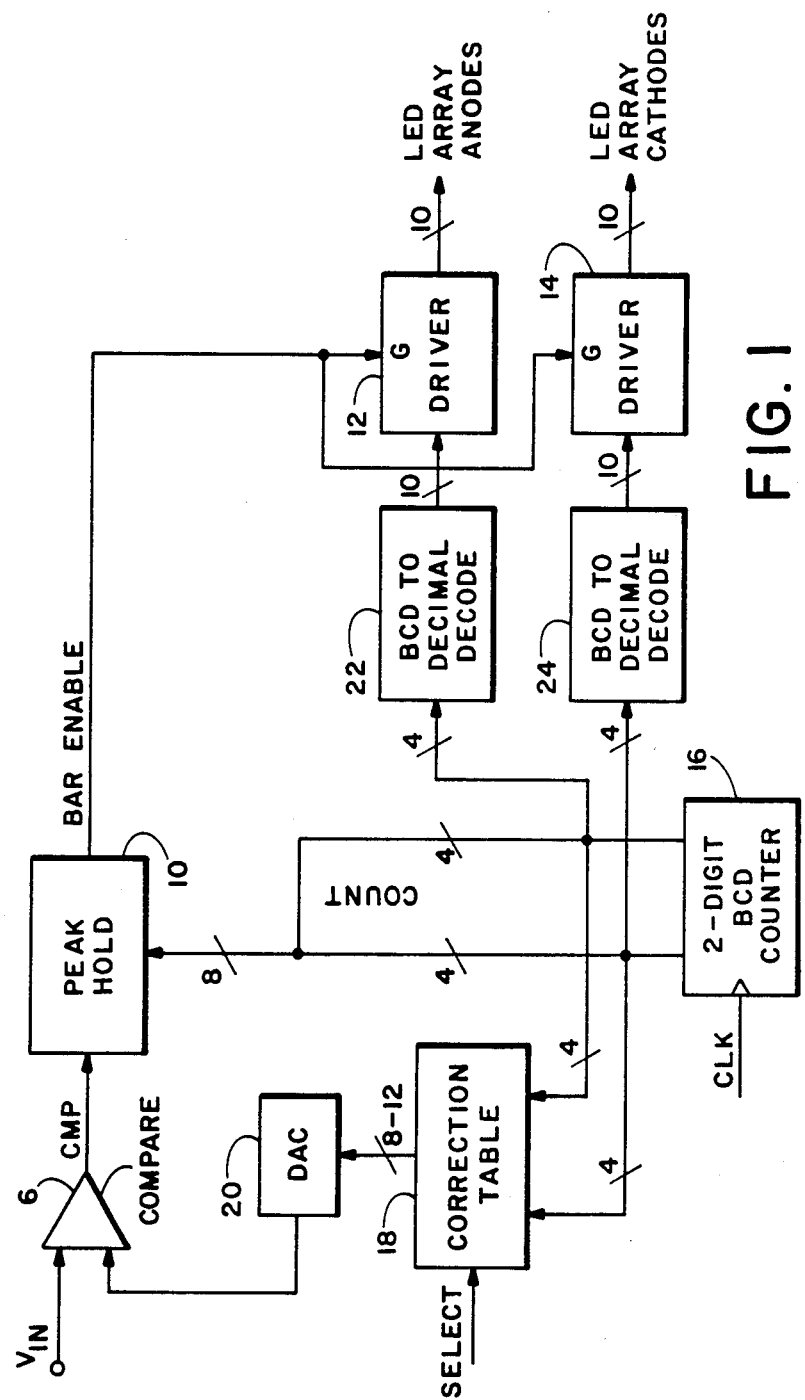
FIG. 1 is a block diagram view of a multiple-element display drive circuit incorporating a digital peak-hold circuit according to the present invention.

Referring now to FIG. 1 an analog voltage $V_{in}$ is input to a comparator 6, the output of which is a compare signal CMP representative of the instantaneous value of $V_{in}$, as described in co-pending U.S. patent application Ser. No. 850,198, cited supra. CMP is input to a peak-hold circuit 10 where a BAR ENABLE signal is generated to gate on the LED drivers 12 and 14. A two-digit BCD counter 16 counts down from 99 to 00 for a 100-element display device, the output COUNT of which addresses a correction table 18. The output of the correction table 18 is input to a digital to analog DAC 20, the output of the DAC being a ramp-like signal which is input to the comparator 6 for comparison with $V_{in}$. Thus CMP is a logical "1" when $V_{in}$ is equal to or greater than the output of the DAC 20, and a logical "0" otherwise. COUNT from the counter 16 also is input to the peak-hold circuit 10 and to a pair of BCD to decimal decoders 22 and 24 which provide the current count to the drivers 12 and 14 as described in the co-pending U.S. patent application cited supra.

Figure 2:
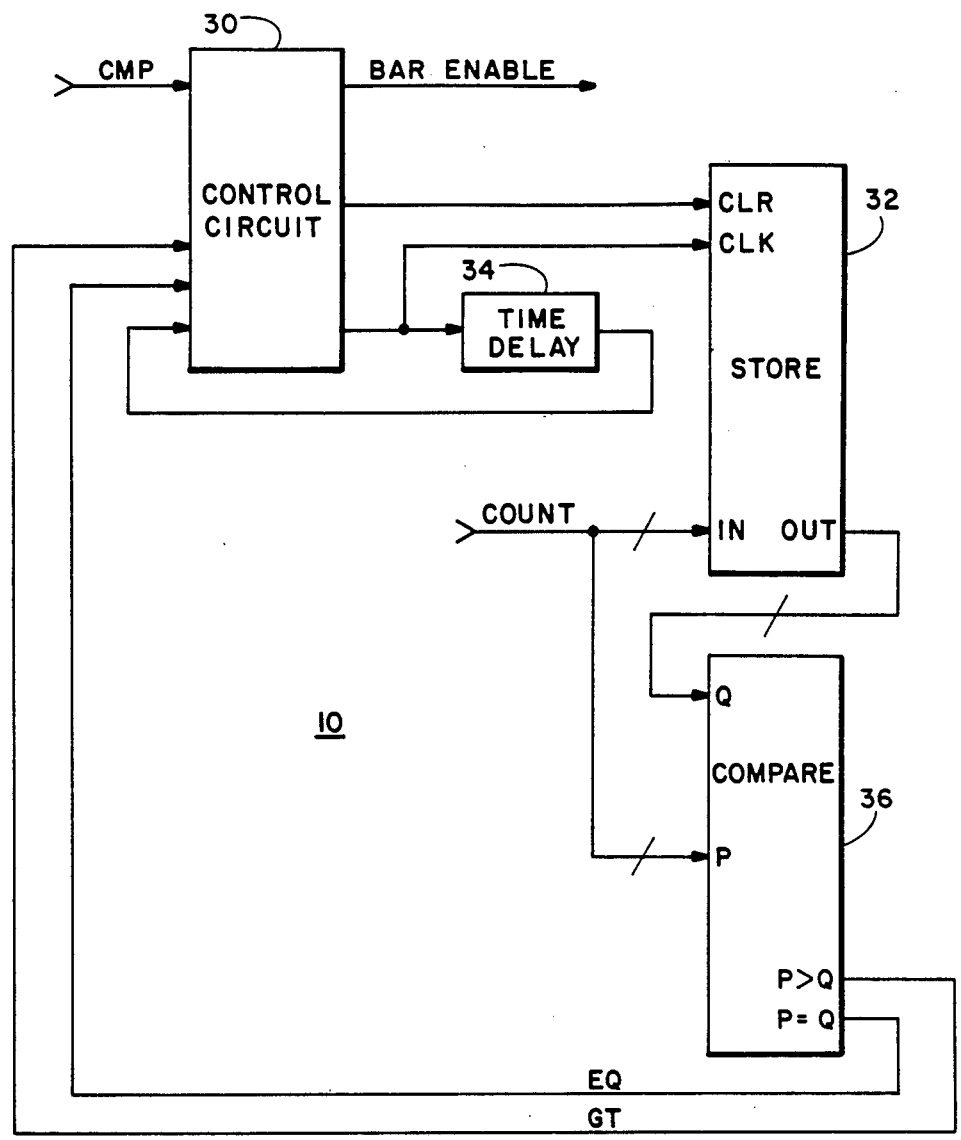
FIG. 2 is a block diagram view of the digital peak-hold circuit of FIG. 1.
Figure 3:
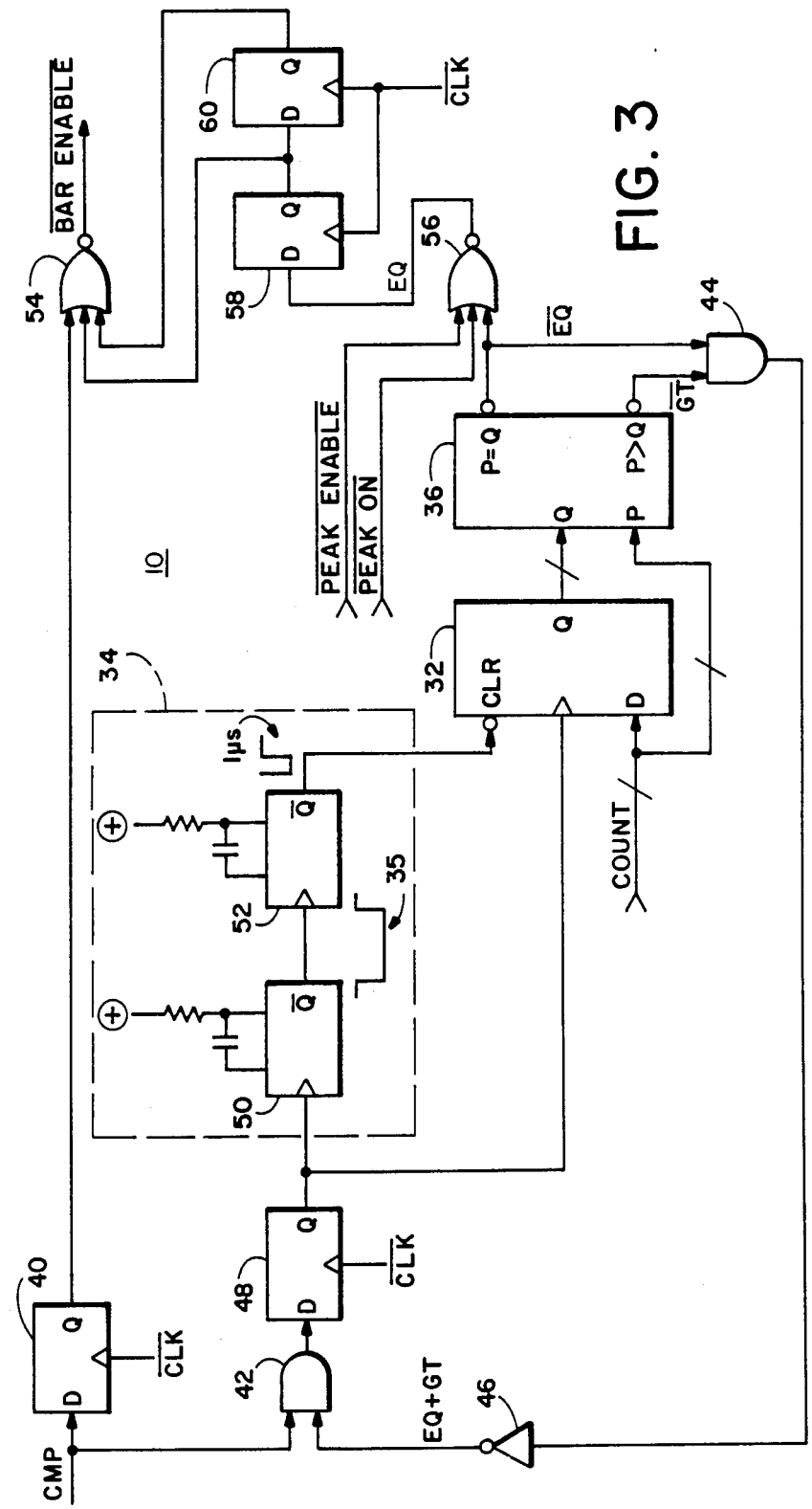
FIG. 3 is an equivalent logic diagram view of the digital peak-hold circuit of FIG. 2.

The peak-hold circuit 10 is shown in greater detail in FIGS. 2 and 3. The peak-hold circuit 10 has a control circuit 30 to which is input CMP and which outputs the BAR ENABLE signal. The control circuit 30 also controls a storage register 32 and a time delay circuit 34. The storage register 32, when clocked by the control circuit 30, stores the COUNT from the counter 16 which represents the current peak value. Each time a new peak value is stored in the storage register 32, the time delay circuit 34 is restarted. If the time delay circuit 34 times out, indicating that the current peak value has not changed over a predetermined period, the control circuit 30 clears the storage register 32 and then clocks in a new peak value, restarting the time delay circuit. The stored value in the storage register 32 is compared with the instantaneous COUNT in a digital comparator 36. When the COUNT is greater than or equal to the stored peak value, the digital comparator 36 outputs a signal GT or EQ to the control circuit 30. If GT or EQ occurs when CMP is a logical "1", indicating the $V_{in}$ is equal to or greater than the output of the DAC 20, the control circuit 30 clocks the storage register 32 to store a new peak value and restarts the time delay circuit. If GT or EQ occurs when CMP is a logical "0", indicating that $V_{in}$ is less than the output of the DAC 20, the control circuit 30 takes no action.

FIG. 3 is a logical representation of the interaction of the control circuit 30 and the storage register 32, the time delay circuit 34 and the digital comparator 36. The compare signal CMP is input to a first D-type flip-flop 40 and a first gate 42. The first flip-flop is clocked at the COUNT rate, i.e., if the counter 16 cycles 300 times per second and there are 100 display elements, the clock rate is 30 kHz. The gate 42 is opened by the EQ or GT signal from the digital comparator 36 via gate 44 and inverter 46. The output of gate 42 is input to a second D-type flip-flop 48, the output of which strobes the storage register 32 and triggers the time delay circuit 34. The time delay circuit 34 is equivalent to a pair of retriggerable monostable circuits 50 and 52 connected in series. The first monostable circuit 50 has a long time constant, such as three seconds, and the second monostable circuit 52 has a short time constant, such as one microsecond. So long as the first monostable circuit 50 is triggered by the output from the second flip-flop 48 before the long time constant has timed out, the second monostable circuit 52 is not triggered and generates no output pulse. If the first monostable circuit 50 times out before it is triggered again, it triggers the second monostable circuit 52 which generates a short duration pulse to clear the storage register 32.

The output of the first flip-flop 40 is input to an output gate 54 which has two additional inputs to provide a two-element display for the peak value in addition to the instantaneous value. The EQ output of the digital comparator 36 is input to a gate 56 which has a PEAK ON input and a PEAK ENABLE input as well. The gate 56 is closed if the peak detector is selected to be off or if the peak values are below a predetermined threshold. Otherwise the EQ signal is passed to a third D-type flip-flop 58, the output of which is one of the inputs to the output gate 54 and is input to a fourth D-type flip-flop 60. The output of the fourth flip-flop 60 is the third input to the output gate 54. Since the third and fourth flip-flops 58 and 60 are clocked by the same COUNT clock, EQ is high for one clock cycle and that value is clocked through the successive flip-flops to produce the two-element display for the peak value.

Figure 4:
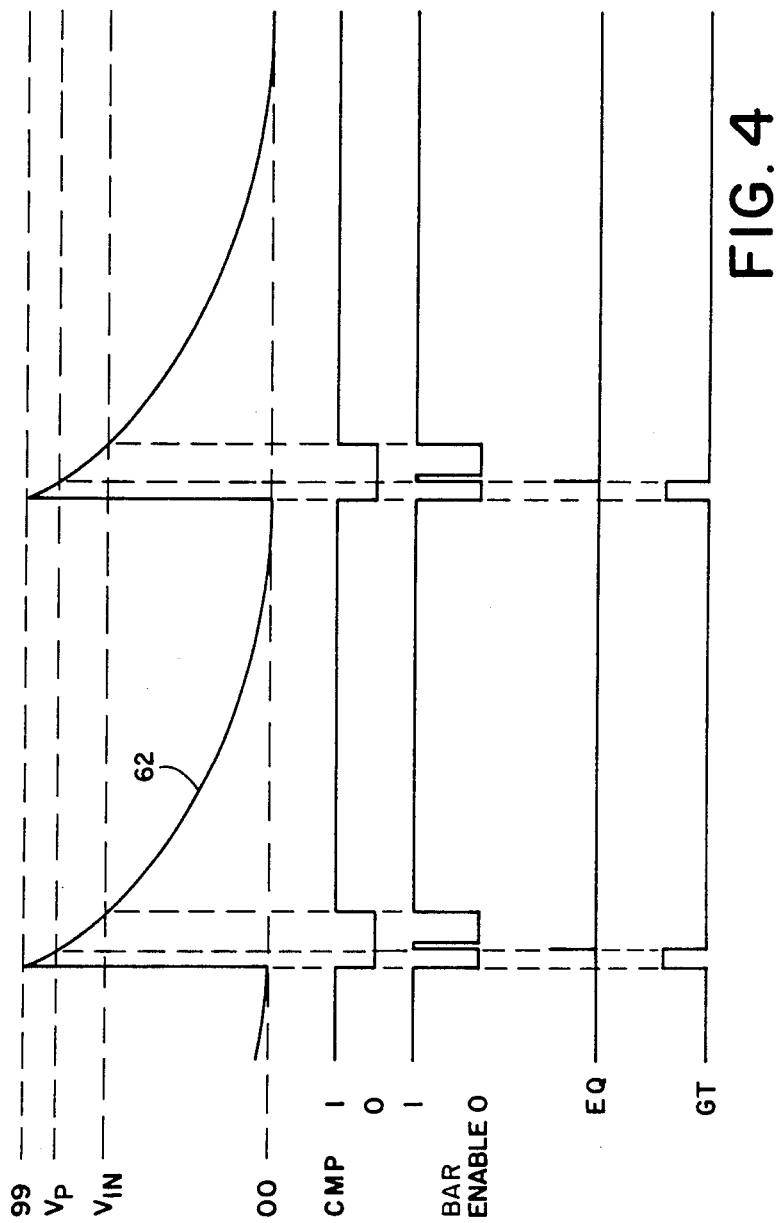
FIG. 4 is a timing diagram view to illustrate the operation of the digital peak-hold circuit according to the present invention.

As shown in FIG. 4 the DAC output 62 is a ramp-like waveform corresponding to counting down from 99 to 00. The output of the comarator 6, CMP, is a logical "1" when $V_{in}$ is greater than or equal to the output of the DAC 20 and a logical "0" otherwise. In this illustration the peak value stored, $V_p$, is greater than $V_{in}$ so that at the COUNT corresponding to COUNT=$V_p$ a two-element logical "1" is added to CMP to produce the BAR ENABLE signal which gates on the LED display drivers 12 and 14.

Thus, the present invention provides a digital peak-hold detector which stores a peak value, compares the peak value with a repetitive count corresponding to the number of elements in an output display, and updates the peak value when the input voltage value exceeds the peak value or when the peak value has not been updated for a predetermined period of time.

What is claimed is:

1. A digital peak-hold detector comprises:
   means for storing a digital value representative of a current peak value;
   means for determining when the value of an input analog voltage is greater than or equal to a ramp-like voltage corresponding to a repetitive count cycle to generate a compare output;
   means for comparing the current peak value from the storing means with the repetitive count cycle to determine when the count of the repetitive count cycle is equal to or greater than the current peak value to generate an update output; and
   means for updating the current peak value in the storing means from a combination of the compare output and the update output when the input analog voltage equals or exceeds the current peak value.

2. A digital peak-hold detector as recited in claim 1 further comprises means for clearing the storing means when the current peak value is not updated within a predetermined period of time.

3. A digital peak-hold detector as recited in claim 2 further comprises means for generating an output signal representative of the instantaneous value of the input analog voltage and the current peak value by combining the compare output with an equality signal from the comparing means generated when the current peak value equals the count of the repetitive count cycle.

4. A digital peak-hold detector as recited in claim 3 wherein the generating means comprises:
   means for generating a peak signal of a given duration from the equality signal; and
   means for combining the peak signal with the compare signal to produce the output signal.

5. A digital peak-hold detector as recited in claim 2 wherein the clearing means comprises:
   a retriggerable monostable circuit having a long time constant corresponding to the predetermined period of time which is triggered by the updating means when the current peak value is updated in the storing means; and
   a monostable circuit in series with the output of the retriggerable monostable circuit and having a short time constant, the monostable circuit being triggered by the retriggerable monostable circuit when the predetermined period of time expires, to generate a clear pulse to clear the storing means.

* * * * *